(12) United States Patent
Ito et al.

(10) Patent No.: US 7,365,561 B2
(45) Date of Patent: Apr. 29, 2008

(54) TEST PROBE AND TESTER, METHOD FOR MANUFACTURING THE TEST PROBE

(75) Inventors: Haruki Ito, Nagano (JP); Shinji Mizuno, Nagano (JP); Koji Yamaguchi, Okinawa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/184,763

(22) Filed: Jul. 19, 2005

(65) Prior Publication Data

US 2006/0049840 A1   Mar. 9, 2006

(30) Foreign Application Priority Data

Sep. 9, 2004   (JP) .............................. 2004-262273

(51) Int. Cl.
*G01R 31/00*   (2006.01)
(52) U.S. Cl. .................................... 324/770
(58) Field of Classification Search ................. 324/770
See application file for complete search history.

(56) References Cited

U.S. PATENT DOCUMENTS 5,546,375 A * 8/1996 Shimada et al. ............ 369/126
5,834,945 A * 11/1998 Akram et al. ............... 324/755
5,926,029 A * 7/1999 Ference et al. ............. 324/762
6,144,216 A * 11/2000 Kajiwara et al. ........... 324/770
6,289,583 B1   9/2001 Belmont et al.
6,300,998 B1   10/2001 Aruga
6,333,555 B1 * 12/2001 Farnworth et al. .......... 257/737
6,603,467 B1 * 8/2003 Wu ........................... 345/204
6,882,388 B2 * 4/2005 Sugiura et al. .............. 349/113

FOREIGN PATENT DOCUMENTS

| CN | 1252129 | 5/2000 |
|---|---|---|
| JP | 2000-56285 | 2/2000 |
| JP | 2002-071764 | 3/2002 |
| JP | 2004-157127 | 6/2004 |
| JP | 2004-186333 | 7/2004 |

* cited by examiner

*Primary Examiner*—Ha Tran Nguyen
*Assistant Examiner*—Roberto Velez
(74) *Attorney, Agent, or Firm*—Harness, Dickey & Pierce, P.L.C.

(57) ABSTRACT

A test probe having a conductive part electrically connected to terminals of a test-object device, including: a silicon substrate; a protrusion made of resin provided on the silicon substrate; a first conductive part which is provided on the protrusion and comes in contact with the terminals; and a second conductive part which is provided in a region other than a region having the protrusion on the silicon substrate and is electrically connected to the first conductive part.

9 Claims, 7 Drawing Sheets

TEST PROBE AND TESTER, METHOD FOR MANUFACTURING THE TEST PROBE

RELATED APPLICATIONS

This application claims priority to Japanese Patent Application No. 2004-262273 filed Sep. 9, 2004 which is hereby expressly incorporated by reference herein in its entirety.

BACKGROUND OF THE INVENTION

1. Technical Field

The present invention relates to a test probe and a tester and a method for manufacturing the test probe.

2. Related Art

In a general procedure of manufacturing a liquid-crystal panel display, there is a process in which short circuit, wire breakage, display characteristics, and the like are tested. In such a test process, a tester having a test probe is used. The test probe includes a conductive part having a plurality of connection terminals connected to scanning line terminals or data line terminals of the liquid-crystal panel display which is the device to be tested (the object device). A distance between the connection terminals (hereinafter referred to as a "pitch of the probe-side terminals" when appropriate) corresponds to a distance between the scanning line terminals or between the data line terminals (hereinafter referred to as a "pitch of the object-side terminals" when appropriate) of the liquid-crystal display panel. The patent publication referenced below discloses an example of a technique pertaining to a tester having a test probe. The test probe disclosed in this patent publication includes a conductive part having the connection terminals on a flexible substrate made of polyimide or the like.

Japanese Unexamined Patent Publication No. 2000-56285 is the example of related art.

However, there is a problem in the described conventional technology. Along with the liquid-crystal panel display that is becoming more highly precise in recent years, the pitch of the object-side terminals is becoming smaller (narrower). Accordingly, the pitch of the probe-side terminals of the test probe is also required to be smaller (narrower). However, with a composition of the conventional technology containing the conductive part having the connection terminals on the flexible substrate, it is difficult to narrow the pitch of the probe-side terminals.

SUMMARY

An advantage of the invention is to provide a test probe that can cope with narrowing of the pitch of the probe-side terminals and can test the object device well, a tester having the test probe, and a method for manufacturing the test probe.

According to an aspect of the invention, a test probe having a conductive part electrically connected to terminals of a test-object device includes: a silicon substrate; a protrusion made of resin provided on the silicon substrate; a first conductive part which is provided on the protrusion and comes in contact with the terminals; and a second conductive part which is provided in a region other than a region having the protrusion on the silicon substrate and is electrically connected to the first conductive part.

In this case, because the conductive part is formed on the silicon substrate, it is possible to obtain a minute conductive part. Accordingly, the test probe can cope with the narrowing of the pitch of the object-side terminals. Further, because the first conductive part that directly contacts the terminals of the object device is provided on the protrusion made of resin, the first conductive part can well contact the terminals of the object device when brought into contact due to the elasticity of the resin protrusion that is a base of the first conductive part.

With the test probe of the invention, the first conductive part may include a plurality of first wiring patterns arranged in a first direction corresponding to the terminals, and the second conductive part may include a plurality of second wiring patterns corresponding to the first wiring patterns.

In this case, because the first conductive part may include the plurality of first wiring patterns arranged in the first direction so as to correspond with the plurality of terminals of the object device arranged in the first direction, the test probe can well test the object device by bringing the first wiring patterns into contact with the terminals. Also, because the second conductive part may include the second wiring patterns formed on the silicon substrate corresponding to the first wiring patterns, the test probe can have the second wiring patterns that are minute.

With the test probe of the invention, the protrusion may extend in the first direction so as to hold each of the plurality of first wiring patterns.

In this case, because the protrusion may be formed so as to extend in the first direction along the arrangement direction of the first wiring patterns, the plurality of first wiring patterns can be provided on the same protrusion. Therefore, variation in the arrangement of the first wiring patterns in the height direction can be minimized.

With the test probe of the invention, a region on the protrusion surface other than a region having the first wiring patterns may be dented.

In this case, because the region on the surface of the protrusion other than the region having the first wiring patterns, or, more specifically, the region between the first wiring patterns, may be dented, the protrusion as the base of the first wiring patterns may deform when coming in contact with the terminals of the object device. Accordingly, due to the deformation, the first wiring patterns can well contact the terminals of the object device.

With the test probe of the invention, the protrusion surface may be formed in a shape of an arch when seen cross-sectionally, bulging in a direction opposite from the silicon substrate.

In this case, because the first conductive part may be formed on the surface of the protrusion having a shape of an arch when seen cross-sectionally, the conductive part can well contact the terminals. Further, because the protrusion surface may be arched when seen cross-sectionally, the first conductive part can well adhere to the protrusion surface when setting the first conductive part on the protrusion surface.

With the test probe of the invention, a first insulating layer may be provided between the silicon substrate and the second conductive part.

In this case, because the silicon substrate may be electrically insulated from the second conductive part by the first insulating layer, the object device can be well tested.

With the test probe of the invention, the first insulating layer may include organic matter.

In this case, by composing the first insulating layer with organic matter, namely, an organic resin, the second conductive part provided on the layer thereon can well contact outer devices.

With the test probe of the invention, a second insulating layer may be provided so as to cover the first insulating layer.

In this case, the second conductive part can be protected by the second insulating layer.

With the test probe of the invention, a third insulating layer made of resin may be provided on a second surface of the silicon substrate opposite from a first surface having the protrusion and the conductive part.

In this case, the third insulating layer made of resin can protect the second surface of the silicon substrate and prevent breakage of the silicon substrate.

With the test probe of the invention, the third insulating layer may include a sheet form.

In this case, the third insulating layer may be provided on the second surface of the silicon substrate by simply adhering the sheet form to the second surface of the silicon substrate.

With the test probe of the invention, an electronic unit that supplies an electric signal to the terminals may be mounted on the silicon substrate.

In this case, a highly precise display test is possible when the object device is, for example, a display device.

According to another aspect of the invention, a tester of the invention may include the above-described test probe.

In this case, the object device can be well tested by use of the test probe that can cope with the narrowing of the pitch of the object device.

With the tester of the invention, a part of the second conductive part may be electrically connected to a second substrate mounted with the electronic unit that supplies an electric signal to the terminals.

In this case, the electronic unit is mounted on the second substrate that is different from the test probe directly connected to the object device, and, by connecting the second substrate with the part of the second conductive part of the test probe, a highly precise display test is possible if the test-object is the display device. Further, even when the test probe directly connected to the object device deteriorates, only the test probe needs be replaced instead of replacing the electronic unit with a new one.

With the tester of the invention, the second substrate may include a silicon substrate.

In this case, by also forming the second substrate with silicon, the conductive part corresponding to the conductive part of the test probe that is already minutely made can be formed on the second substrate.

With the tester of the invention, the second substrate may include a glass substrate.

In this case, because the second substrate may be a glass substrate, it is possible to grasp visually (or by use of an optical position-detection device) the connection of the conductive part of the second substrate connected to the second conductive part of the test probe while positioning them through the second glass substrate during the connection. Therefore, the positioning during the connection can be carried out smoothly.

According to yet another aspect of the invention, a method for manufacturing a test probe includes: having a conductive part electrically connected to terminals of a test-object device; providing a protrusion made of resin on a silicon substrate; providing a first conductive part that comes in contact with the terminals on the protrusion; and providing a second conductive part that is electrically connected to the first conductive part in a region other than a region having the protrusion on the silicon substrate.

In this case, because the conductive part may be formed on the silicon substrate, it is possible to obtain the minute conductive part. Accordingly, the test probe can cope with the narrowing of the pitch of the object-side terminals. The first conductive part that comes directly in contact with the terminals of object device may be provided on the protrusion made of resin, and, therefore, when the first conductive part contacts the terminals of the test-object, the first conductive part can well contact the terminals of the object device due to the elasticity of the resin protrusion being the base of the first conductive part.

The method of the invention may further include: forming the protrusion so as to extend in a first direction; and providing a plurality of first wiring patterns in the first direction on the protrusion as the first conductive part.

In this case, because the protrusion may be formed so as to extend in the first direction along the direction in which the first wiring patterns are arranged, the plurality of first wiring patterns can be provided on the same protrusion. Therefore, variation in the arrangement of the first wiring patterns in the height direction can be minimized.

The method of the invention may further include denting a region on the protrusion surface other than a region having the first wiring patterns by half-etching.

In this case, because the region on the surface of the protrusion other than the region having the first wiring patterns, or, more specifically, the region between the first wiring patterns, may be dented, the protrusion as the base of the first wiring patterns may deform when coming in contact with the terminals of the object device. Accordingly, due to the deformation, the first wiring patterns can well contact the terminals of the object device.

The method of the invention may further include forming the protrusion in a shape of an arch when seen cross-sectionally, the surface thereof bulging in a direction opposite from the silicon substrate.

In this case, because the first conductive part may be provided on the surface of the protrusion in a shape of an arch when seen cross-sectionally, the conductive part can well contact the terminals. Further, because the protrusion surface may be arched in a cross-sectional view, the first conductive part can well adhere to the protrusion surface when setting the first conductive part on the protrusion surface.

The method of the invention may further include forming the protrusion by dispensing a function liquid containing the protrusion-forming resin from a liquid dispensing head onto the silicon substrate.

In this case, the protrusion can be smoothly formed without wastefully using the material.

The method of the invention may further include forming a second insulating layer so as to cover the second conductive part.

In this case, the second conductive part may be protected by the second insulating layer.

The method of the invention may further include thinning the silicon substrate.

In this case, by thinning the silicon substrate and giving elasticity thereto, handling of the test probe my be easy; the test probe can well contact the object device; and, further, the second conductive part can well contact other devices such as the second substrate.

The method of the invention may further include providing a third insulating layer made of resin on a second surface of the silicon substrate opposite from a first surface having the protrusion and the conductive part.

In this case, the third insulating layer made of resin can protect the second surface of the silicon substrate and can prevent breakage of the thinned silicon substrate.

The method of the invention may further include adhering a sheet form to the second surface of the silicon substrate as the third insulating layer.

In this case, the third insulating layer may be provided on the second surface of the silicon substrate by simply adhering the sheet form to the second surface of the silicon substrate.

The method of the invention may further include thinning the silicon substrate by treating the second surface before providing the third insulating layer.

In this case, the silicon substrate may obtain elasticity when thinned, and, furthermore, the breakage or the like of the thinned silicon substrate may be prevented.

The method of the invention may further include dicing the silicon substrate per every test probe after forming the plurality of test probes on the same silicon substrate almost simultaneously.

In this case, by forming the plurality of test probes almost simultaneously, followed by dicing of the silicon substrate per every test probe, the test probe can be manufactured effectively and at low cost.

The method of the invention may further include: adhering a sheet form to the second surface of the silicon substrate opposite from the first surface having the protrusion and the conductive part; and dicing the silicon substrate together with the sheet form.

In this case, dicing can be smoothly conducted by adhering the sheet form to the silicon substrate before dicing. Then, by simply using the sheet form used for the dicing as the third resin layer, the number of the manufacturing steps can be reduced, and the test probes can be manufactured at low cost.

BRIEF DESCRIPTION OF THE DRAWINGS

The invention will be described with reference to the accompanying drawings, wherein like numbers refer to like elements and wherein.

DESCRIPTION OF THE EMBODIMENTS

Embodiments of the invention will now be described. In the following descriptions, an XYZ rectangular coordinate system is established, and a positional relation of the elements will be described with reference to this system. Further, a predetermined direction on a level surface is an X-axis direction; a direction perpendicular to the X-axis direction on the level surface is a Y-axis direction; and a direction perpendicular to both X- and Y-axis directions (in other words, a vertical direction) is a Z-axis direction. Furthermore, rotational directions around the X-, Y-, and Z-axis are $\theta X$, $\theta Y$, and $\theta Z$, respectively.

<Test Probe>

First Embodiment

Figure 1:
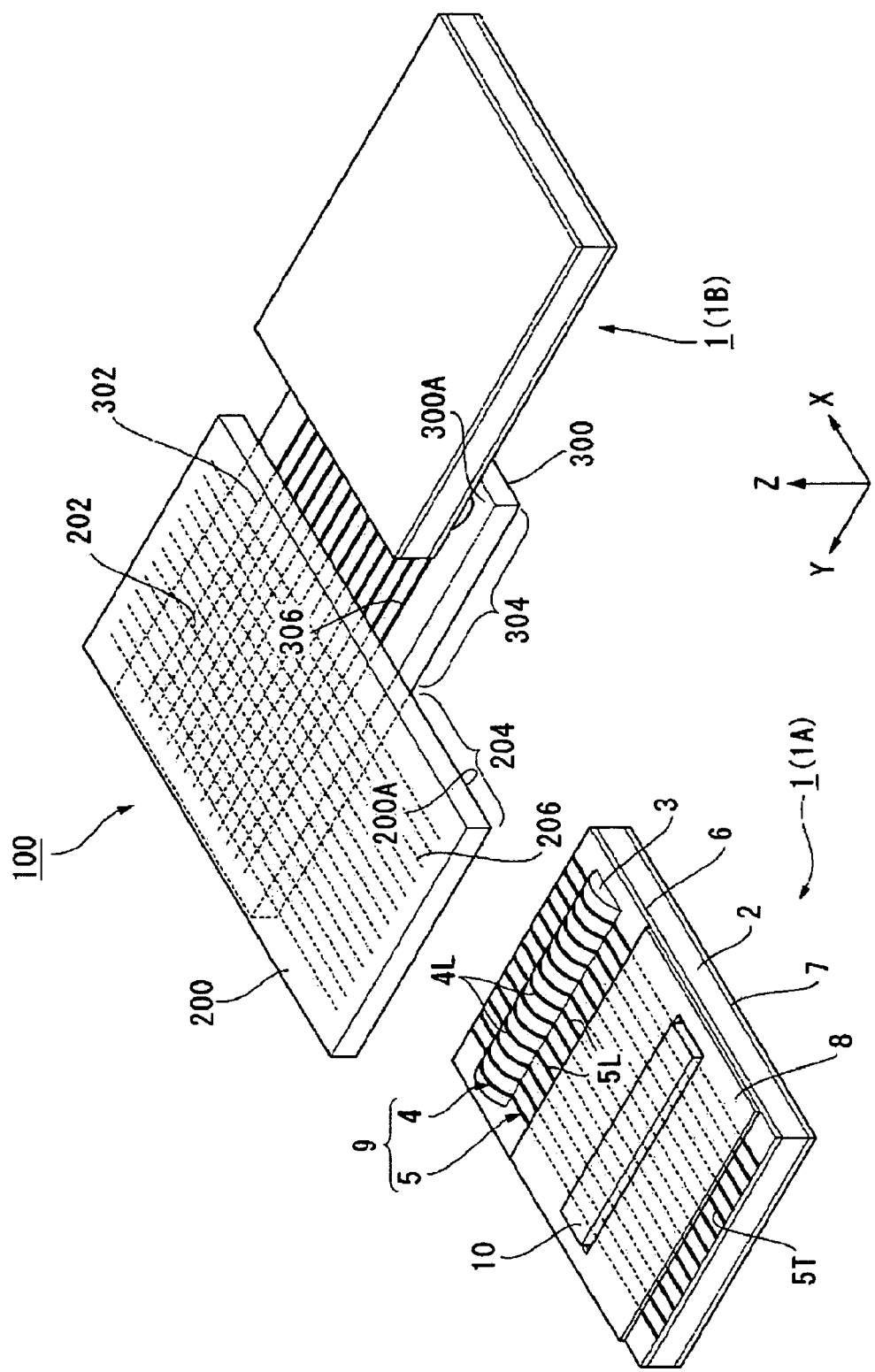
FIG. 1 is a perspective view of a first embodiment of the test probe.
Figure 2:
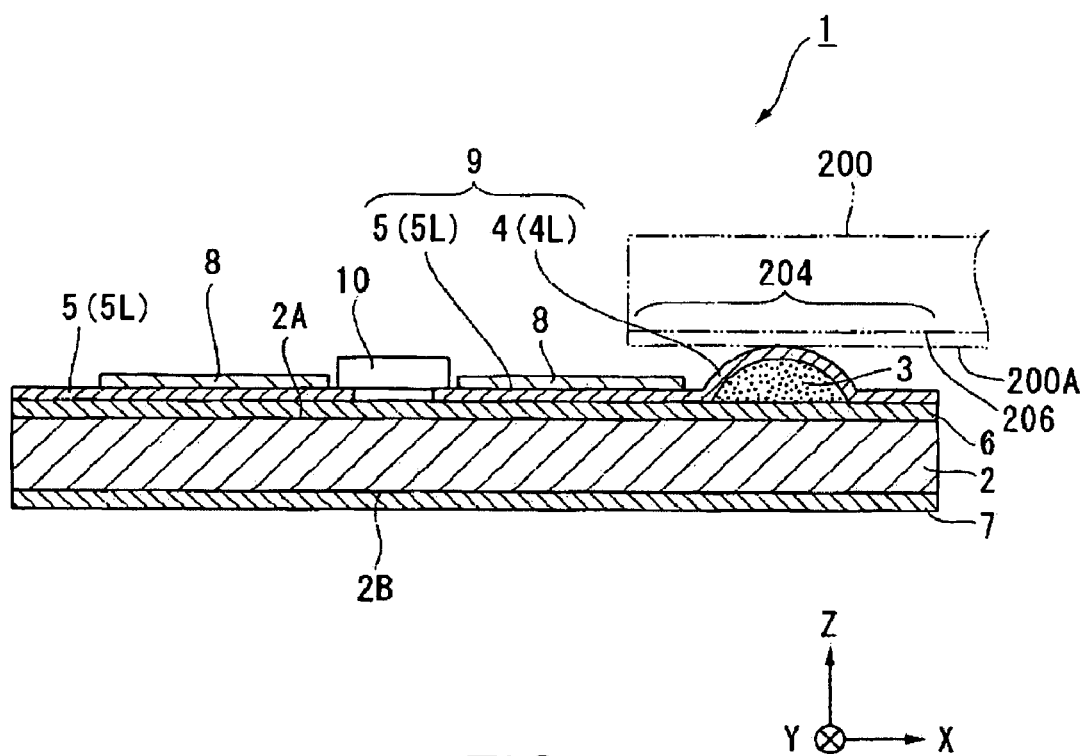
FIG. 2 is a cross-sectional view of the test probe.
Figure 3:
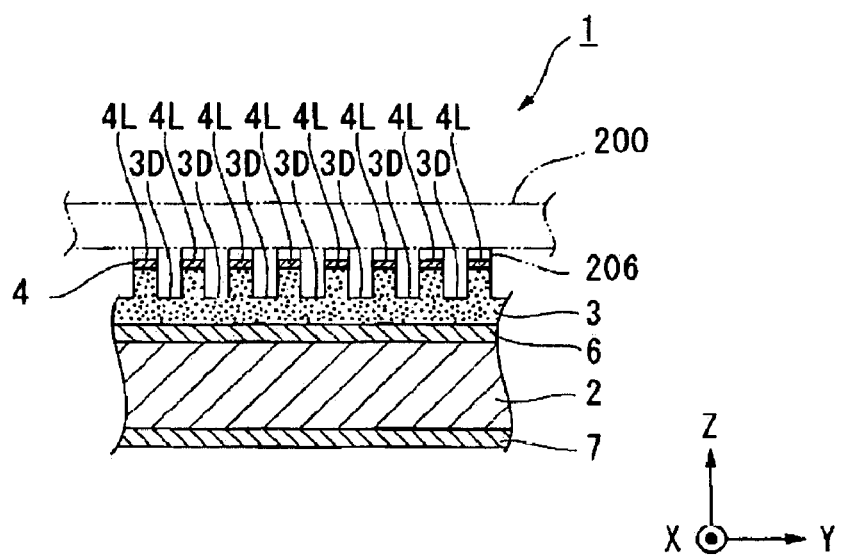
FIG. 3 is an enlarged cross-sectional view of the test probe.

The first embodiment of the test probe will be described with reference to the accompanying drawings. FIG. 1 shows perspective views of a test probe 1 of the present embodiment and a part of a liquid-crystal panel display that is the device to be tested. FIG. 2 is a sectional side view of the test probe 1 (1A), and FIG. 3 is a diagram of the test probe 1A seen from a +X side.

In these drawings, the test probe 1 (1A, 1B) includes: a silicon substrate 2, a protrusion 3 made of resin and provided on the silicon substrate 2, and a conductive part 9 provided on the silicon substrate 2 and electrically connected to scanning line terminals 206 or data line terminals 306 of the liquid-crystal panel display 100 which is the test object device. The conductive part 9 is composed of a first conductive part 4 provided on the protrusion 3 on the silicon substrate 2 and a second conductive part 5 provided in a region on the silicon substrate 2 other than the region having the protrusion 3 and electrically connected to the first conductive part 4. There is a first insulating layer 6 between the silicon substrate 2 and the second conductive part 5, and the second conductive part 5 is provided on an upper surface of the first insulating layer 6. Further, the protrusion 3 is also provided on the upper surface of the first insulating layer 6. Also, on the silicon substrate 2, a third insulating layer 7 made of resin is provided on an upper surface 2A having thereon the first insulating layer 6, the protrusion 3, and the first and second conductive parts 4 and 5 and on a lower surface 2B opposite the upper surface 2A.

The test probe 1 is used for testing short circuit or wire breakage in the liquid-crystal panel display 100, which is the device to be tested, or for testing the display characteristics and the like. As shown in FIG. 1, the liquid-crystal panel display 100 has two substrates 200 and 300 made of glass or the like, which are put together so as to oppose one another. Further, liquid crystal is encapsulated into a gap between the substrates 200 and 300. On the two substrates 200 and 300, a plurality of scanning lines 202 are formed along the X-axis direction in parallel to each other on a lower surface 200A of the substrate 200 (a surface opposite from the substrate 300), and a plurality of data lines 302 are formed along the Y-axis direction in parallel to each other on a upper surface 300A of the substrate 300 (a surface opposite from the substrate 200). Furthermore, on the lower surface 200A of the substrate 200, the plurality of scanning line terminals 206 that draw out the scanning lines 202 to the outside are arranged in the Y-axis direction in a predetermined region of a −X-side end portion 204. Likewise, on the lower surface 300A of the substrate 300, the plurality of data line terminals 306 that draw out the data lines 302 to the outside are arranged in the X-axis direction in a predetermined region of a −Y-side end portion 304.

Additionally, the liquid-crystal panel display 100 having such a composition is generally applied to an active matrix liquid-crystal panel in which pixel electrodes are driven by use of a two-terminal type nonlinear element such as a thin film diode (TFD), or to a passive matrix liquid-crystal panel in which a nonlinear element is not used. However, the invention can also be applied to other liquid-crystal panels such as one having terminals that draw out the scanning lines and data lines to the outside on one of the substrates, such as, for example, an active matrix liquid-crystal panel using a three-terminal type nonlinear element such as a thin film transistor (TFT) element which is used as an element to switch the pixel electrodes.

The scanning line terminals 206 are tip portions of the plurality of scanning lines 202 formed on the substrate 200. Now, with a liquid-crystal panel display 100 determined as normal by the tester of the embodiment, a bear chip for driving each of the scanning lines is coupled to the scanning line terminals 206 and to outer terminals (not shown) which are provided so as to oppose the scanning line terminals 206 at a position away from the scanning line terminals 206 in the predetermined region 204. The bear chip is mounted on the substrate 200 by a technique such as a chip-on-glass (COG) technique, and the outer terminals are coupled to flexible printed circuits (FPCs) that supply control signals from the outside to the bear chip. Similarly, also on a portion of the data line terminals 306 on the substrate 300, the bear chip and the FPCs are coupled. However, since the present embodiment is targeted at the liquid-crystal panel display 100 before being tested, neither the bear chip nor the FPCs are mounted or coupled at this point.

In the following, the test probe 1 (1A) that conducts the test upon being coupled to the scanning line terminals 206 of the liquid-crystal panel display 100 will be described. However, a description of the test probe 1 (1B) that conducts the test upon being coupled to the data line terminals 306 will be omitted, since the test probes 1A and 1B have an identical composition.

The first conductive part 4 of the test probe 1(1A) is composed of a plurality of first wiring patterns 4L arranged in the Y-axis direction corresponding to the scanning line terminals 206. The first wiring patterns 4L are provided so as to be coupled to each of the scanning line terminals 206. A distance between the first wiring patterns 4L (the pitch of the probe-side terminals) corresponds to a distance between the scanning line terminals 206 (the pitch of the object-side terminals) of the liquid-crystal panel display 100. Further, the second conductive part 5 is composed of a plurality of second wiring patterns 5L provided corresponding to the first wiring patterns 4L. The second wiring patterns 5L are each coupled to the first wiring patterns 4L, arranged and extending in the X-axis direction, in the region other than the region having the protrusion 3 on the silicon substrate 2 (the first insulating layer 6).

A material used to form the first conductive part 4 or the second conductive part 5 is, for example, gold (Au), copper (Cu), silver (Ag), titanium (Ti), tungsten (W), titanium tungsten (TiW), nickel (Ni), nickel vanadium (NiV), chromium (Cr), or aluminum (Al).

Since the plurality of first wiring patterns 4L are arranged in the Y-axis direction so as to correspond with the scanning line terminals 206 of the liquid-crystal panel display 100, the test probe 1 can well test the liquid-crystal panel display 100 by contacting the first wiring patterns 4L with the scanning line terminals 206. Further, by using a flexible material such as silver (Ag) as the material for forming the first conductive part 4 (the first wiring patterns 4L), the first wiring patterns 4L can adhere well to the scanning line terminals 206.

The protrusion 3 is provided at a +X-side end portion on the silicon substrate 2, extending in the Y-axis direction so as to be able to support each of the plurality of first wiring patterns 4L, that is, to be able to hold each of the plurality of first wiring patterns 4L. The surface of the protrusion 3 is formed in a shape of an arch when seen cross-sectionally, bulging in an opposite direction, that is, in an upper (+Z) direction, from the silicon substrate 2, and the protrusion 3 as a whole is in a half-cylindrical shape. Further, as shown in FIG. 3, the region on the surface of the protrusion 3 other than the region having the first wiring patterns 4L is dented, forming dented parts 3Ds between the first wiring patterns 4L.

As thus described, because the protrusion 3 is formed so as to extend in the Y-axis direction along the direction in which the first wiring patterns 4L are arranged, the plurality of first wiring patterns 4L can be provided on the same protrusion 3. Therefore, variation in the arrangement of the first wiring patterns in the height direction can be minimized. Also, because the first wiring patterns 4L of the first conductive part 4 are held on the surface of the half-cylindrically shaped protrusion 3, they can well contact the scanning line terminals 206. Further, because the surface of the protrusion 3 is arched when seen cross-sectionally, the first wiring patterns 4L can be adhered well to the surface of the protrusion 3 when forming the first wiring patterns 4L thereon. Furthermore, because the regions between the first wiring patterns 4L are the dented parts 3Ds on the surface of the protrusion 3, the protrusion 3 which is the base of the first wiring patterns 4L deforms when the first wiring patterns 4L come in contact with the scanning line terminals 206. Accordingly, due to the deformation, the first wiring patterns 4L can well contact the scanning line terminals 206. Here, it is desirable that the dented part 3D of the resin part 3 of has a depth of 5 µm or more. The protrusion 3 can thereby sufficiently deform.

As mentioned above, the protrusion 3 is composed of resin (synthetic resin). A material for forming the protrusion 3 is, for example, polyimide resin, silicone-modified polyimide resin, epoxy resin, silicone-modified epoxy resin, acrylic resin, phenol resin, benzocyclobutene (BCB), or polybenzoxazole (PBO).

The first insulating layer 6 is used to electrically insulate the silicon substrate 2 from the second conductive part 5 and is provided on the surface of the silicon substrate 2. The first insulating layer 6 may be inorganic matter such as $SiO_2$ or organic matter (resin). In this case, if the first insulating layer 6 is composed of organic matter (organic resin), owing to its elasticity, the second conductive part 5 provided on the upper layer of the first insulating layer 6 can well contact outer devices (a bear chip 10 and a second substrate 20 as will be described later). Further, by using a flexible material such as silver (Ag) as the material for forming the second conductive part 5 (the second wiring patterns 5L), the second conductive part 5 can have good adhesiveness to the outer devices.

On the silicon substrate 2, the bear chip (the electronic unit) 10, which drives each of the scanning lines 202 by supplying electric signals to the scanning line terminals, is mounted on the second conductive part 5 (the second wiring patterns 5L) by use of an anisotropic adhesive or the like. Further, one end portion (+X-side end portion) of the second wiring patterns 5L is coupled to the first wiring patterns 4L as the connection terminals as described, and the other end portion (−X-side end portion) functions as the connection terminals connected to the outer devices. The connection terminals 5T, which are the other end portion of the second conductive part 5, are connected to a circuit substrate (not shown) that supplies the control signals to the bear chip 10. The bear chip 10 here is identical, for example, to one that gets mounted on the predetermined region 204 of the substrate 200 after the test. Accordingly, when testing the liquid-crystal panel display 100, the high-precision display test adjusted to actual driving conditions of the liquid-crystal panel display 100 is possible.

In the region other than the region for mounting the first conductive part 4, the connection terminals 5T, and the bear chip 10, there is provided a second insulating layer 8. The second insulating layer 8 is to cover the second conductive part 5 in the region other than the region for mounting the outer terminals 5T and the bear chip 10, thereby protecting the second conductive part 5. As a material for forming the second insulating layer 8, a synthetic resin such as polyimide resin may be used.

The silicon substrate 2 is formed to have a thickness of 200 μm or less. Consequently, it is easy to conduct paralleling of the liquid-crystal panel display 100 and the substrate 200. Further, because a third insulating layer 7 made of resin is provided on the lower surface 2B of the silicon substrate 2, the lower surface 2B of the silicon substrate 2 is protected by the third insulating layer 7, and breakage (crack) of the second silicon substrate 2 can be prevented.

As a material for forming the third insulating layer 7, a material well known in the art such as polyimide resin may be used. Further, it is possible to form the third insulating layer 7 by coating the lower surface 2B of the silicon substrate 2 with a solution (dispersing solution) including the mentioned material by, for example, spin-coating or, alternatively, by applying the sheet form including the mentioned material on the lower surface 2B of the silicon substrate 2. By using the sheet form in order to form the third insulating layer 7, the third insulating layer 7 can be provided on the lower surface 2B of the silicon substrate 2 by simply applying the sheet form to the lower surface 2B of the silicon substrate 2.

When testing the liquid-crystal panel display 100 using the test probe 1 (1A, 1B) having the above-described composition, as shown in FIG. 1, the first conductive part 4 (the first wiring patterns 4L) of the test probe 1A is brought into contact with the scanning line terminals 206 of the liquid-crystal panel display 100. Then, while keeping the scanning line terminals 206 of the liquid-crystal panel display 100 and the first wiring patterns 4L of the test probe 1A in position, the silicon substrate 2 of the test probe 1A is pressed against the substrate 200 of the liquid-crystal panel display 100 using a presser (not shown) made of elastic matter. As a consequence, the scanning line terminals 206 are adhered and electrically connected to the first wiring patterns 4L. Similarly, while keeping the data line terminals 306 of the liquid-crystal panel display 100 and the first wiring patterns 4L of the test probe 1B in position, the silicon substrate 2 of the test probe 1B is pressed against the substrate 300 of the liquid-crystal panel display 100 using a presser (not shown) made of elastic matter. As a consequence, the data line terminals 306 are adhered and electrically connected to the first wiring patterns 4L.

Then, the control signals (electric signals) to the bear chip 10 are supplied to the connection terminals 5T of each of the test probes 1A and 1B. Consequently, a condition is set for the plurality of scanning lines 202 on the substrate 200 and the plurality of data lines 302 on the substrate 300 to receive from the bear chip 10 the same driving signals as those when the bear chip 10 is mounted on the terminal portions of the substrates 200 and 300 by the COG technique. Accordingly, by examining the liquid display in this condition by use of an image analysis such as a CCD or visually, the display test such as the pixel defect test can be conducted.

Because the conductive part 9 is formed on the silicon substrate 2, the test probe 1 having the composition as described above can have the minute conductive part 9. Accordingly, even if the liquid-crystal panel display 100 becomes more highly precise, and, thereby, the pitch of the scanning line terminals or of the data line terminals narrows, the test probe 1 can cope with the narrowing of the pitch. Further, because the first conductive part 4 that directly comes in contact with the scanning line terminals 206 or the data line terminals 306 of the liquid-crystal panel display 100 is provided on the protrusion 3 made of resin, and because of the elasticity of the resin protrusion 3 being the base of the first conductive part 4, the first conductive part 4 can well contact the scanning line terminals 206 or the data line terminals 306 of the liquid-crystal panel display 100 when brought into contact.

Second Embodiment

Next, the second embodiment will be described. In the following, the same reference numbers are given to the same or similar composition elements as those in the first embodiment, and the descriptions for those elements are simplified or omitted.

In the first embodiment, the bear chip 10 is provided on the silicon substrate 2. However, in the second embodiment, the bear chip 10 is provided on a second substrate 20, which defers from the silicon substrate 2.

Figure 4:
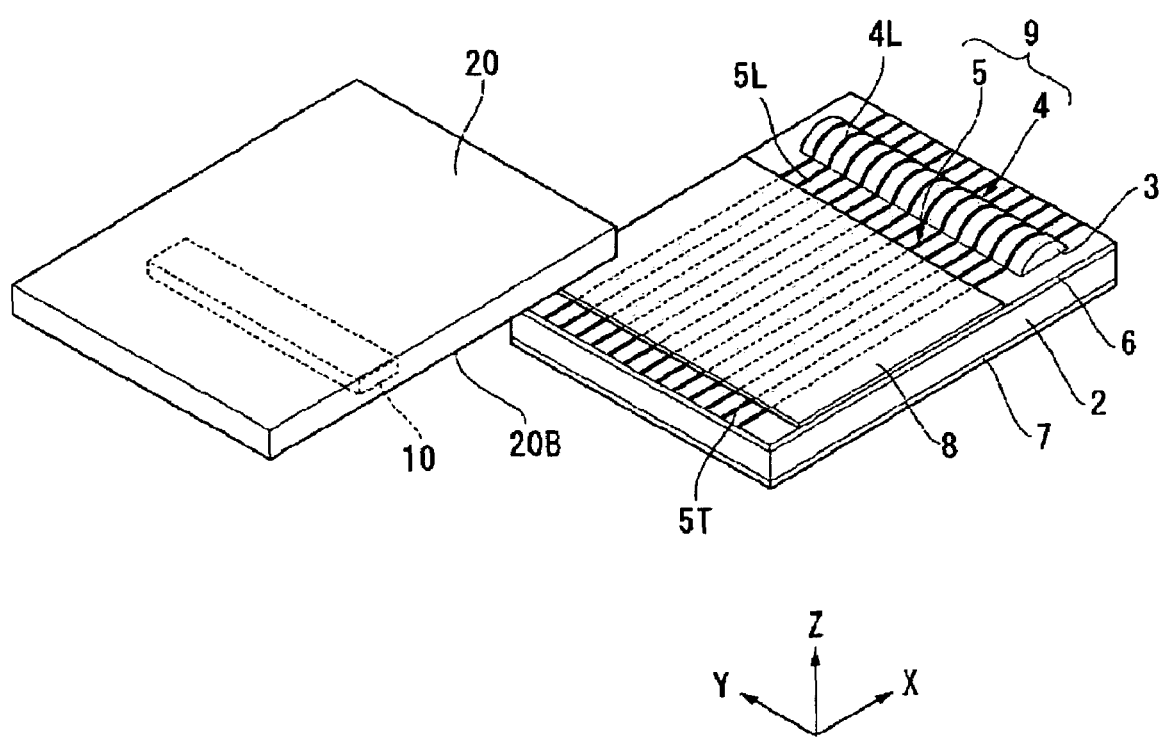
FIG. 4 is a perspective view of a second embodiment.

As shown in FIG. 4, the bear chip 10 is not provided on the silicon substrate 2, and the second insulating layer 8 covers the second conductive part 5 almost entirely excluding the connection terminals 5T. Further, on a lower surface 20B of the second substrate 20, third wiring patterns are formed corresponding to the connection terminals 5T composed of the −X-side end portion of the second wiring patterns 5L of the second conductive part 5. The bear chip 10 is mounted on the third wiring patterns provided on the lower surface 20B of the second substrate 20. Then, by electrically connecting the third wiring patterns of the second substrate 20 with the connection terminals 5T of the silicon substrate 2, the electric signals are supplied from the bear chip 10 to the scanning line terminals 206 of the liquid-crystal panel display 100 through the third wiring patterns, the connection terminals 5T, the second wiring patterns 5L, and the first wiring patterns 4L.

The second substrate 20 is composed of a glass substrate. Consequently, when connecting the third wiring patterns on the lower surface 20B of the second substrate 20 with the connection terminals 5T of the second conductive part 5 on the silicon substrate 2 while positioning them visually (or by use of the optical position-detection device), for example, it is possible to check the connection condition of the third wiring patterns on the second substrate 20 connected to the connection terminals 5T on the silicon substrate 2 through the second substrate 20 made of glass (seeing through the second substrate 20). Hence, the positioning at the time of connection can be smoothly carried out.

Alternatively, the second substrate 20 can be composed of silicon. By composing the second substrate 20 with silicon, the third wiring patterns corresponding to the connection terminals 5T (the second wiring patterns 5L) of the minutely-made test probe 1 can be formed on the second substrate 20.

(Method for Manufacturing the Test Probe)

Next, the method for manufacturing the test probe 1 will be described with reference to FIGS. 5-7. It is to be noted here that a plurality of (in the drawings, two) test probes 1 are formed simultaneously.

Figure 5A:
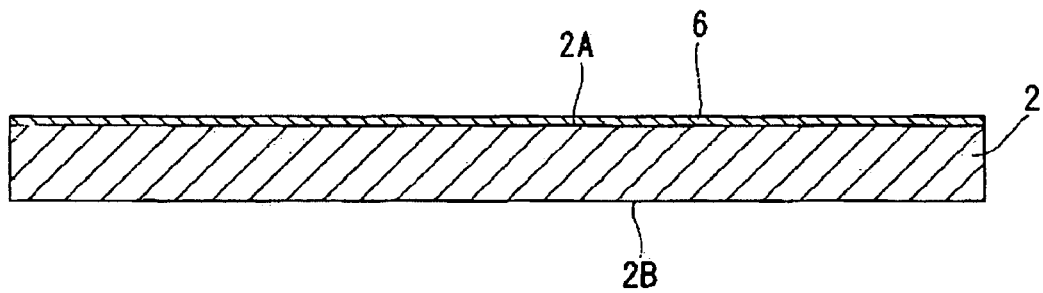
FIG. 5 shows an example of a process for manufacturing the test probe.
Figure 5B:
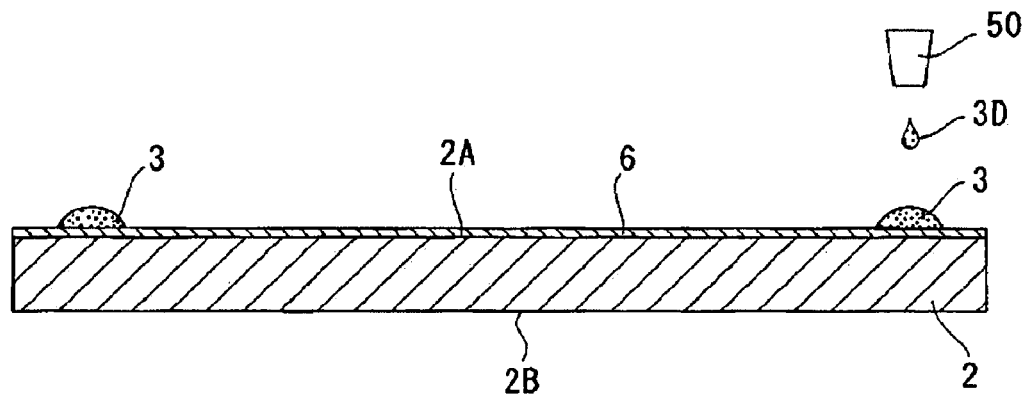
Figure 5C:
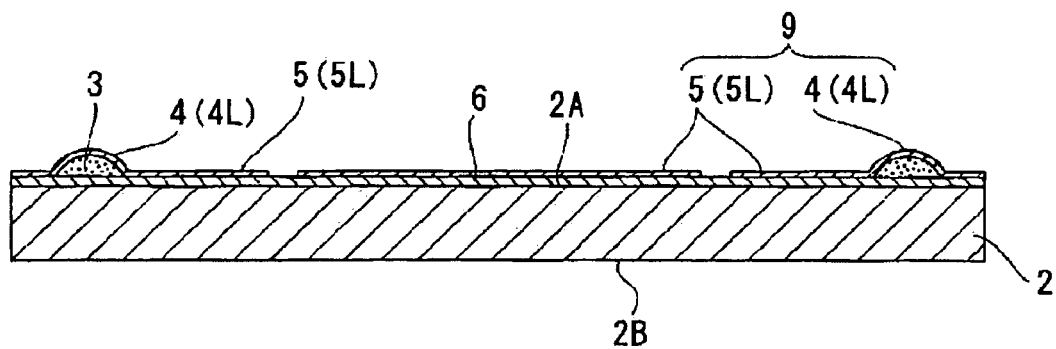

First, as shown in FIG. 5(A), the first insulating layer 6 is formed on the upper surface 2A of the silicon substrate 2. Then, as shown in FIG. 5(B), the resin for forming the protrusion 3 is disposed on the predetermined region on the first insulating layer 6. The protrusion 3 is formed into the half-cylindrical shape, extending in the predetermined direction (the Y-axis direction) on the silicon substrate 2. In this embodiment, the protrusion 3 is formed based on a liquid dispensing method (an ink-jet method). According to the liquid dispensing method, as shown in FIG. 5(B), a liquid dispensing head (an ink-jet head) 50 dispenses a liquid drop 3D that is a functional liquid containing the resin for forming the protrusion 3 onto the silicon substrate 2 (the first insulating layer 6). As a consequence, the protrusion 3 having the shape of an arch in a cross-sectional view whose surface bulges in the direction opposite (that is, in the upper direction) from the silicon substrate 2 is formed. By forming the protrusion 3 by the liquid dispensing method, the material can be used economically, and the protrusion 3 can be formed smoothly. Alternatively, the protrusion 3 may be formed by a photolithography method. In this case, the protrusion 3 contains a photosensitive resin. Depending on conditions of exposure, development, curing, and the like, the protrusion 3 having the shape of an arch in a cross-sectional view can be formed easily and with high precision. Next, as shown in FIG. 5(C), the conductive part 9 including the first and second conductive parts 4 and 5 is formed on each of the protrusion 3 and the first insulating layer 6. The conductive part (wiring pattern) 9 can be formed by sputtering, plating, and liquid dispensing (ink-jet) methods. On the protrusion 3, the plurality of first wiring patterns 4L arranged in a longitudinal direction of the protrusion 3 are formed as the first conductive part 4 that come in contact with the scanning line terminals 206. In the region other than the region where the protrusion 3 is provided, the second wiring patterns 5L electrically connected to the first wiring patterns 4L are formed.

Figure 6A:
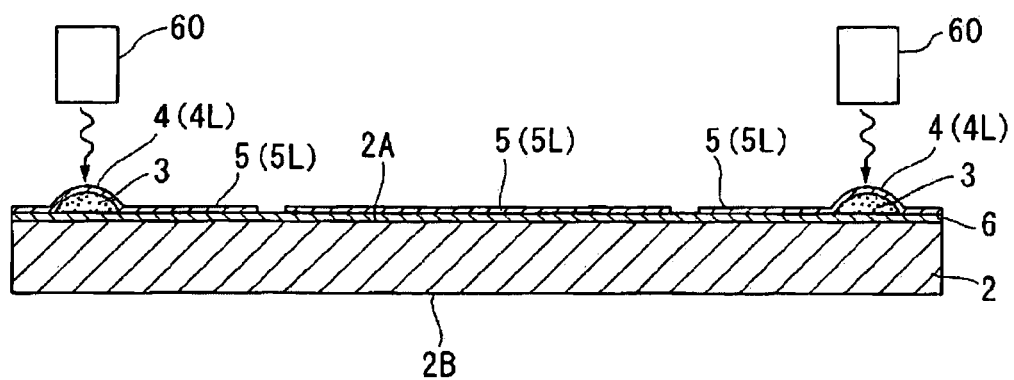
FIG. 6 shows an example of a process for manufacturing the test probe.
Figure 6B:
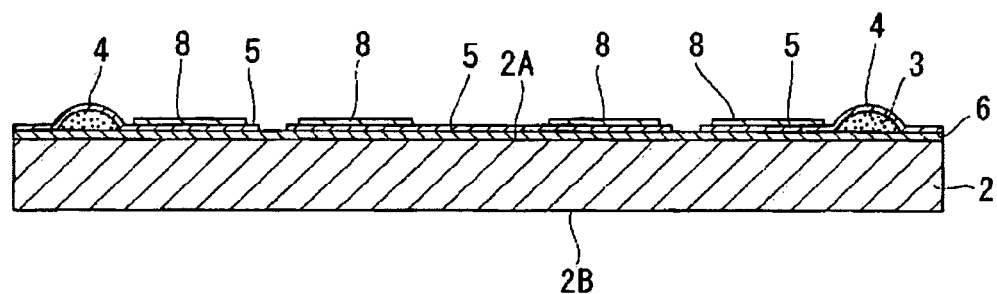
Figure 6C:
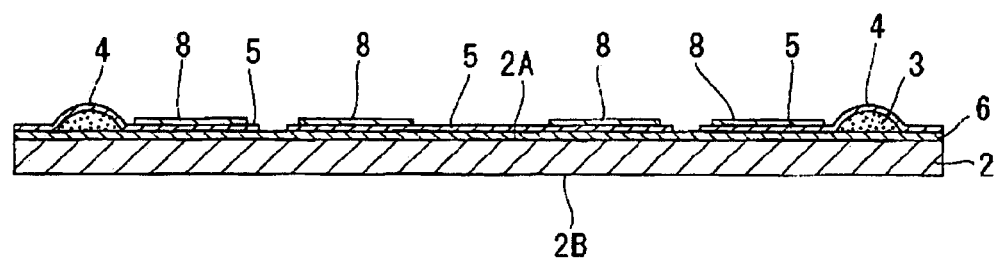

Next, as shown in FIG. 6(A), an $O_2$ plasma treatment is conducted. By the $O_2$ plasma treatment, the region on the surface of the protrusion 3 other than the region having the first wiring patterns 4L is selectively half-etched, while the first wiring patterns 4L are a mask. As a consequence, as shown in FIG. 3, the dented parts 3Ds are formed between the first wiring patterns 4L. Then, as shown in FIG. 6(B), the second insulating layer 8 that covers the second conductive part 5 is provided. Thereafter, a given process such as a polishing process is carried out to the lower surface 2B of the silicon substrate 2, and, because of this treatment, the silicon substrate 2 is thinned to have the desired thickness (of 200 μm or less).

Figure 7A:
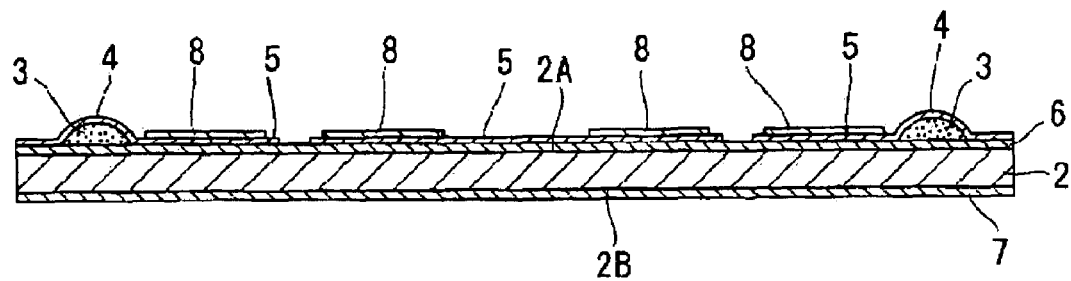
FIG. 7 shows an example of a process for manufacturing the test probe.
Figure 7B:
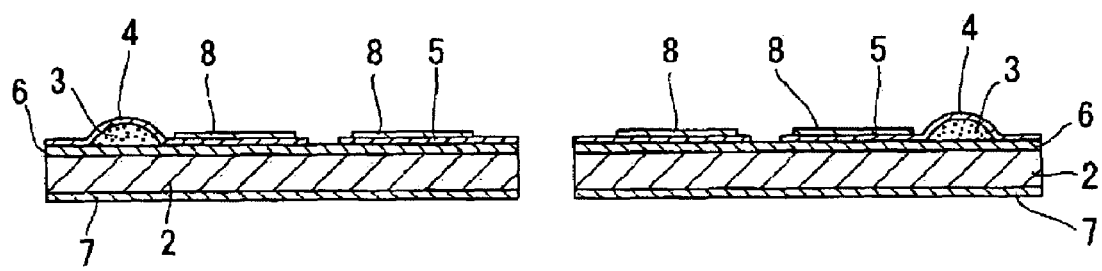
Figure 7C:
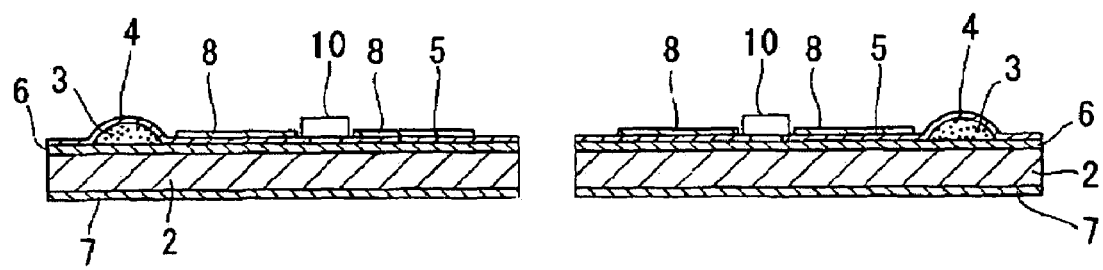

Next, as shown in FIG. 7(A), the sheet form that acts as the third insulating layer 7 is applied to the lower surface 2B of the silicon substrate 2 opposite from the upper surface 2A on which the protrusion 3 and the conductive part 9 are provided. As described, in the embodiment, the plurality of test probes 1 are formed on the same silicon substrate 2. Then, by using the applied sheet form as a sheet for dicing, the silicon substrate 2 is diced (cut) per every test probe 1 together with the sheet form as shown in FIG. 7(B). By thus forming the plurality of test probes 1 almost simultaneously on the silicon substrate 2, and then by dicing the silicon substrate 2 per every test probe 1, the test probes 1 can be efficiently produced while enabling reduction of the cost of the test probes 1. Then, by simply using the sheet form used for the dicing as the third resin layer 7, the number of steps required for the manufacture can be reduced, and the manufacture of the test probes 1 can be realized at low cost. After the dicing, the bear chips 10 are mounted as shown in FIG. 7(C), and the test probes 1 can be obtained.

<Tester>

Figure 8:
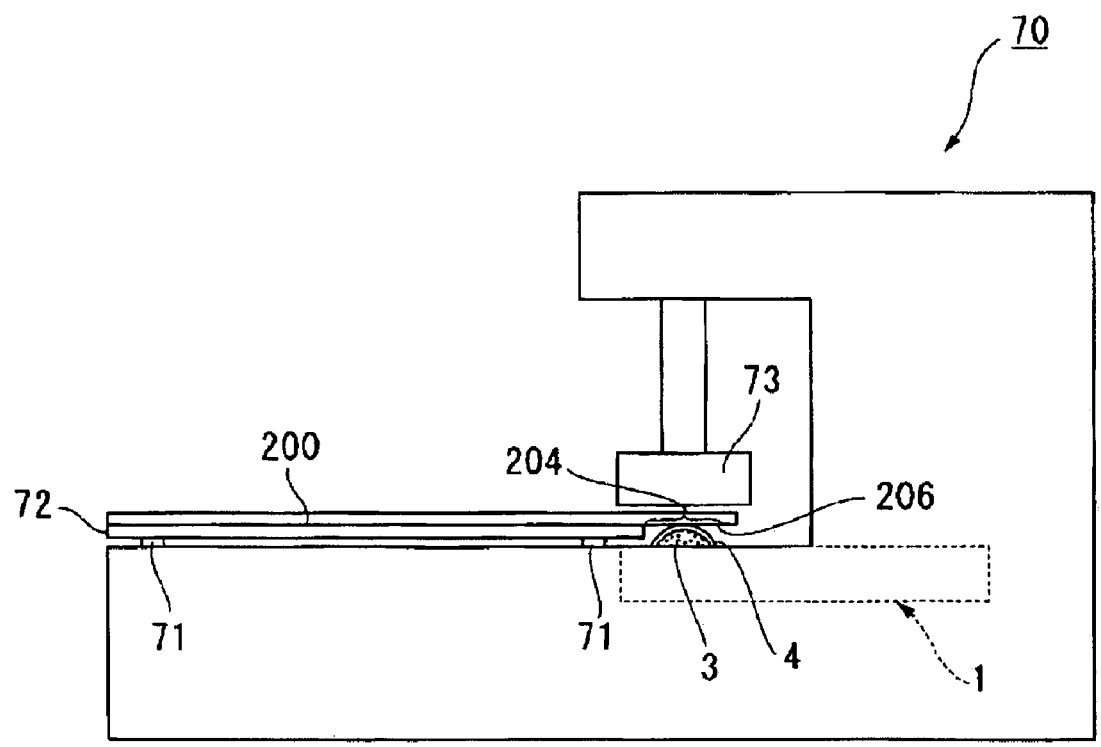
FIG. 8 is a flat pattern view of a working example of a tester.

FIG. 8 is a diagram outlining an example of a tester 70 having the test probe 1. In FIG. 8, the tester 70 includes a holder 72 for holding the substrate 200, which is the device to be tested, and an adjustment unit 71 that can adjust the positions and postures of the holder 72 holding the substrate 200. The holder 72 holds the region other than the predetermined region 204 on the substrate 200. At a position opposite the predetermined region 204 on the substrate 200 held by the holder 72, the first conductive part 4 provided on the protrusion 3 of the test probe 1 is arranged. Also, there is a presser 73 made of elastic matter above the first conductive part 4 interposing the substrate 200. With the tester 70, while keeping the scanning line terminals 206 of the substrate 200 and the first conductive part 4 of the test probe 1 in position, the substrate 200 is pressed against the test probe 1 by the presser 73 made of elastic matter. As a consequence, the scanning line terminals 206 are adhered and electrically connected to the first wiring patterns 4L. A condition is thereby set for the plurality of scanning lines 202 on the substrate 200 to receive from the bear chip 10 the same driving signals as those when the bear chip 10 is mounted on the portion of the scanning line terminals 206 of the substrate 200 by the COG technique. Therefore, by examining the liquid display in this condition by use of the image analysis such as the CCD or visually, the display test such as the pixel defect test can be conducted. Additionally, the composition of the tester 70 may include the second substrate 20 as described with reference to FIG. 4.

It is to be noted that the device to be tested by the test probe and the tester of the invention is not limited to the liquid-crystal panel display. Any device having terminals can be tested by the test probe and the tester of the invention.

What is claimed is:

1. A test probe having a conductive part electrically connected to terminals of a test-object device, comprising:
   a silicon substrate having a thickness of 200 μm or less;
   a protrusion made of resin provided on the silicon substrate, the protrusion surface being formed in a shape of an arch when seen cross-sectionally, bulging in a direction opposite from the silicon substrate;
   a first conductive part provided on the protrusion so that the protrusion is disposed between the first conductive part and the substrate, the first conductive part being adapted to come in contact with the terminals;
   a second conductive part provided on the silicon substrate in a region other than a region having the protrusion, the second conductive part being electrically connected to the first conductive part;
   a first insulating layer provided between the silicon substrate and the second conductive part;
   a second insulating layer provided so as to cover the first insulating layer;
   a third insulating layer made of resin provided on a second surface of the silicon substrate opposite from a first surface having the protrusion and the conductive part; and
   an electronic unit mounted on the second conductive part by an anisotropic adhesive and supplying electric signals to the terminals through the first conductive part, the electronic unit being identical to an electronic unit that is mounted on the test-object device for driving the test-object device after a test;
   wherein the first conductive part includes a plurality of first wiring patterns arranged in a Y-axis direction corresponding to scanning line terminals of the test-object device, the second conductive part includes a plurality of second wiring patterns coupled to the first wiring patterns, arranged to extend in an X-axis direction perpendicular to the Y-axis direction in the region other than the region having the protrusion, and the protrusion extends in the Y-axis direction and supports each of the plurality of first wiring patterns.

2. The test probe according to claim 1, wherein the protrusion holds each of the plurality of first wiring patterns.

3. The test probe according to claim 1, wherein a region on the protrusion surface other than the region having the first wiring patterns is dented.

4. The test probe according to claim 1, wherein the first insulating layer includes organic matter.

5. The test probe according to claim 1, wherein the third insulating layer includes a sheet form.

6. A tester having the test probe of claim 1.

7. The tester according to claim 6, wherein a part of the second conductive part is electrically connected to a second substrate mounted with the electronic unit that supplies an electric signal to the terminals.

8. The tester according to claim 7, wherein the second substrate includes a silicon substrate.

9. The tester according to claim 7, wherein the second substrate includes a glass substrate.

* * * * *